United States Patent [19]
Kim

[11] Patent Number: 6,162,673
[45] Date of Patent: Dec. 19, 2000

[54] METHOD OF MANUFACTURING SRAM CELL

[75] Inventor: Jae-Kap Kim, Ichon, Rep. of Korea

[73] Assignee: Hyundai Electronics Industries Co. Ltd., Ich'on, Rep. of Korea

[21] Appl. No.: 09/338,815

[22] Filed: Jun. 23, 1999

Related U.S. Application Data

[62] Division of application No. 09/256,464, Feb. 23, 1999, which is a division of application No. 08/825,298, Mar. 27, 1997, Pat. No. 5,966,321.

[30] Foreign Application Priority Data

Mar. 28, 1996 [KR] Rep. of Korea .......................... 96-8946

[51] Int. Cl.⁷ ................................................ H01L 21/8244
[52] U.S. Cl. ............................................. 438/238; 438/210
[58] Field of Search ................................... 438/152, 153, 438/154, 210, 238, 275, 279

[56] References Cited

U.S. PATENT DOCUMENTS

| | | | |
|---|---|---|---|
| 4,499,652 | 2/1985 | Shrivastava | 29/571 |
| 5,047,818 | 9/1991 | Tsukamoto | 357/23.6 |
| 5,264,385 | 11/1993 | Rodder | 438/238 |
| 5,311,464 | 5/1994 | Takase et al. | 365/156 |
| 5,324,973 | 6/1994 | Sivan | 257/330 |
| 5,386,379 | 1/1995 | Ali-Yahia et al. | 365/49 |
| 5,396,098 | 3/1995 | Kim et al. | 257/344 |
| 5,396,449 | 3/1995 | Atallah et al. | 365/49 |
| 5,406,107 | 4/1995 | Yamaguchi | 257/393 |
| 5,515,313 | 5/1996 | Yamaguchi | 365/156 |

FOREIGN PATENT DOCUMENTS

| | | |
|---|---|---|
| 53-53281 | 5/1978 | Japan . |
| 57-60853 | 4/1982 | Japan . |
| 4-192189 | 7/1992 | Japan . |
| 5-57855 | 7/1993 | Japan . |
| 5-304274 | 11/1993 | Japan . |
| 7-130880 | 5/1995 | Japan . |

*Primary Examiner*—Chandra Chaudhari

[57] ABSTRACT

An SRAM cell capable of enhancing the cell ratio and method of manufacturing the same are disclosed. The SRAM cell has pull-up devices, pull-down devices and access devices that interconnected at cell nodes, including: current reduction part for reducing current of the access devices, wherein the current reduction part is connected with the access devices and the cell nodes.

9 Claims, 4 Drawing Sheets

METHOD OF MANUFACTURING SRAM CELL

CROSS-REFERENCE TO RELATED APPLICATION

This application is a divisional application of U.S. patent application Ser. No. 09/256,464, filed Feb. 23, 1999, which is itself a divisional application of U.S. patent application Ser. No. 08/825,298, now U.S. Pat. No. 5,966,321 filed Mar. 27, 1997, and from both of which priority is claimed under 35 USC §120. This application also claims priority under 35 USC §119 from Republic of Korea Application No. 96-8946, filed Mar. 18, 1996.

BACKGROUND OF THE INVENTION

1. Field of the Invention

The present invention relates to a semiconductor memory device and method of manufacturing the same, and more particularly, to a static random access memory cell capable of enhancing the cell ratio and method of manufacturing the same.

2. Description of the Related Art

A semiconductor memory device is classified into a dynamic random access memory (DRAM) and a static random access memory (SRAM) according to its memorizing method SRAM is particularly significant due to its high speed, low power consumption, and simple operation. In addition, unlike the DRAM, the SRAM has advantages of straight forward design as well as not having to regularly refresh stored data.

In general, SRAM cell includes: two driving transistors which are the pull-down devices; two access devices; and two pull-up devices. The SRAM cell is further classified as a full CMOS cell, a high road resistor (HRL), or thin film transistor (TFT) cell according to the type of the pull-up devices used.

The full CMOS cell utilizes a P-channel bulk MOSFET as the pull-up device. The HRL cell utilizes a polysilicon having a high resistance value as the pull-up device, and The TFT cell utilizes P-channel polysilicon TFT as the pull-up device. Of the above-mentioned structures, the SRAM cell with the full CMOS cell structure has optimal operational device properties and can be fabricated with a simple process. It, however, has both NMOS and PMOS transistors in the unit cell, resulting in a large cell size. Therefore, it is applied to memory devices having a small capacitance. On the other hand, SRAM cells with the HRL cell and the TFT cell structures have relatively poor performance and is complicated in their fabrication. Because of their small cell size, however they are generally applied to semiconductor memory devices in cases of larger capacitance.

FIG. 1 is a conventional circuit diagram of an SRAM cell with full CMOS cell structure.

As shown in this diagram sources of PMOS transistors Q1 and Q2 for use in pull-up devices are connected to VDD. Drains of the PMOS transistors Q1 and Q2 are respectively connected in series to drains of NMOS transistors Q3 and Q4 for use in pull-down devices at cell nodes N1 and N2. Sources of the NMOS transistors Q3 and Q4 are connected to VSS. Gates of the PMOS transistors Q1 and Q2 are respectively connected to gates of the NMOS transistors Q3 and Q4, and these connection points thereof are respectively cross-coupled with the cell nodes N1, N2. In NMOS transistors Q5 and Q6 for use in access devices, gates are connected to a word line W/L, sources are respectively connected to bit lines B/L1 and B/L2. Drains of NMOS transistors Q5 and Q6 are respectively connected to the drains of the NMOS transistors Q3 and Q4 at the cell nodes N1, N2.

In the above described SRAM cell, the NMOS transistors Q5 and Q6 are turned on by turning on the word line W/L, to store data in a HIGH state in the node N1 and data in a LOW state in the node N2. Data in a HIGH state is inputted to the bit line B/L1 and data in a LOW state is inputted to the bit line B/L2, so that the PMOS transistor Q1 and NMOS transistor Q4 are turned on, and PMOS transistor Q2 and NMOS transistor Q3 are turned off. Therefore, the node N1 becomes a HIGH state and the cell node N2 becomes a LOW state. Furthermore, although the word line W/L is turned off, the cell node N2 is latched to maintain a LOW state and the cell node N1 is maintained at a HIGH state. Accordingly, data is stored in the cell nodes N1 and N2 respectively.

FIG. 2 is a plan view of the SRAM cell illustrated in FIG. 1. Referring to FIG. 2 with cross reference to FIG. 1, A1 and A2 are the active regions of the PMOS transistors Q1 and Q2 for use in pull-up devices, B1 and B2 are the active regions of the NMOS transistors Q3 and Q4 for use in pull-down devices and the NMOS transistors Q5 and Q6 for use in access devices. C1 to C6 are the contact regions. Here, C1 and C2 denote contact regions of cell nodes N1 and N2. C3 and C4 denote contact regions of sources the NMOS transistors Q5 and Q6. C5 denotes contact regions of sources of the PMOS transistors Q1 and Q2, and C6 denotes contact regions of sources of the NMOS transistors Q3 and Q4. There are also provided word lines 34a, 34b, and 54.

Meanwhile, FIG. 3 is sectional view of the active region B1 taken along line III–III' of FIG. 2, and illustrates the sectional structure of the NMOS transistor Q3 for use in pull-down devices and the NMOS transistor Q5 for use in access devices.

As illustrated in FIG. 3, the NMOS transistor Q3 for use in pull-down devices and the NMOS transistor Q5 for use in access devices include: a semiconductor substrate 1 having an active region B1 of the NMOS transistor Q3 for use in pull-down devices and the NMOS transistor Q5 for use in access devices defined by a field oxide layer 2; a gate oxide layer 3 formed on the substrate 1 between the field oxide layer 2 and gates 34a and 54; source regions 5a, 5c and a common drain region 5b formed in the active region B1 both sides of the gates 34a and 54; an intermediate insulating layer 6 formed on the overall surface of the substrate and having a contact hole which expose predetermined portions of the source regions 5a, 5c and the drain region 5b; metal-interconnection layers 7a, 7b and 7c connected with the source regions 5a, 5c and the drain region 5b through the contact holes.

Meanwhile, one of the factors determining the characteristics of the SRAM is the current driving capability ratio of the pull-down device, otherwise known as the driving device and the access device ($I_{DSAT\ DRIVER\ TRANSISTOR}/I_{DSAT\ ACCESS\ TRANSISTOR}$), otherwise known as cell ratio. A higher cell ratio results in improved performance of the SRAM. Therefore when the current amount of the pull-down device is large and the current amount access device is small, the performance of the SRAM cell is improved.

An operation of the SRAM related to the cell ratio is as follows. In case that the data in a low state is stored in the node N1 and the data in a high state is stored in the cell node N2, the voltage of the cell node N1 is determined by the current amount ratio of the NMOS transistors Q5 and Q6 for use in access devices and the NMOS transistors Q3 and Q4 for use in pull down devices. Accordingly, the node N1 is intended to maintain the low voltage with the increase of the current amount of the NMOS transistors Q3 and Q4, and with the decrease of the current amount of the NMOS transistors Q5 and Q6. If so, the voltage of the cell node N1 is not drastically changed from the low state when the NMOS transistors Q5 and Q6 are turned on during the reading operation, even though the voltage of the bit line B/L1 is changed. In case the voltage variation of the cell node N1 is small, the voltage of the cross-coupled the cell node N2 is still maintained in the high state.

Therefore, conventionally, the cell ratio is controlled in a manner wherein width of the NMOS transistor for use in access devices is reduced and its length is increased thereby increasing its the current amount, and width of the NMOS transistor for use in pull-down devices is increased and its length is reduced to thereby reduce its the current amount. The width and length of the transistor, however, cannot be reduced below a predetermined level, and therefore there is a restriction in reducing the size of the cell to enhance the cell ratio.

SUMMARY OF THE INVENTION

Accordingly, an object of the present invention is to provide an SRAM cell and method of manufacturing the same, which insert a resistor between a cell node and a access device thereby reducing the current amount of the access device and enhancing the cell ratio of the SRAM cell.

To achieve the above object, according to the first aspect of the present invention, there is provided an SRAM cell having pull-up devices, pull-down devices and access devices that interconnected at cell nodes, including current reduction means for reducing current of the access devices, wherein the current reduction means are connected with the access devices and the cell nodes.

In this embodiment, the current reduction means is a resistor.

Furthermore, according to the second aspect of the present invention, there is provided an SRAM cell comprising: a semiconductor substrate of a first conductivity type of which active region is defined; a gate insulating layer formed on the substrate; first and second gates formed on the gate insulating layer and a third gate formed between said first and second gates; a channel region of a second conductivity type formed in the active region under the third gate; impurity diffusion regions of the second conductivity type formed in the active region both sides of the first, second and third gates; an intermediate insulating layer formed on the substrate, and having contact holes to expose the impurity diffusion regions located at either side of the first gate and a side of second gate that is not adjacent to third gate; and metal-interconnection layers in contact with exposed impurity diffusion regions through the contact holes.

Furthermore, there is provided a method of manufacturing an SRAM cell having pull-up devices, pull-down devices and access devices, the manufacturing method comprising the steps of: providing a semiconductor substrate of a first conductivity type of which active region of the pull-down device and the access device is defined; forming a channel region of a second conductivity type in a predetermined portion of the active region between the pull-down device and the access device region; forming a gate insulating layer on the substrate; forming first and second gates on the pull-down device and the access device region and a third gate on the channel region; and forming impurity diffusion regions of said second conductivity type in the active region both sides of said first, second and third gates.

In this embodiment, the channel region is formed at the same time that ion implanting of impurity ions the second conductivity type to control a threshold voltage of the pull-up devices occurs.

BRIEF DESCRIPTION OF THE ATTACHED DRAWINGS

The objects and features of the invention may be better understood with reference to the following detailed description, appended claims, and attached drawings wherein:

DETAILED DESCRIPTION OF PREFERRED EMBODIMENT

A preferred embodiment according to the present invention is described below with reference the attached drawings, FIG. 4 to FIG. 6.

Figure 1:
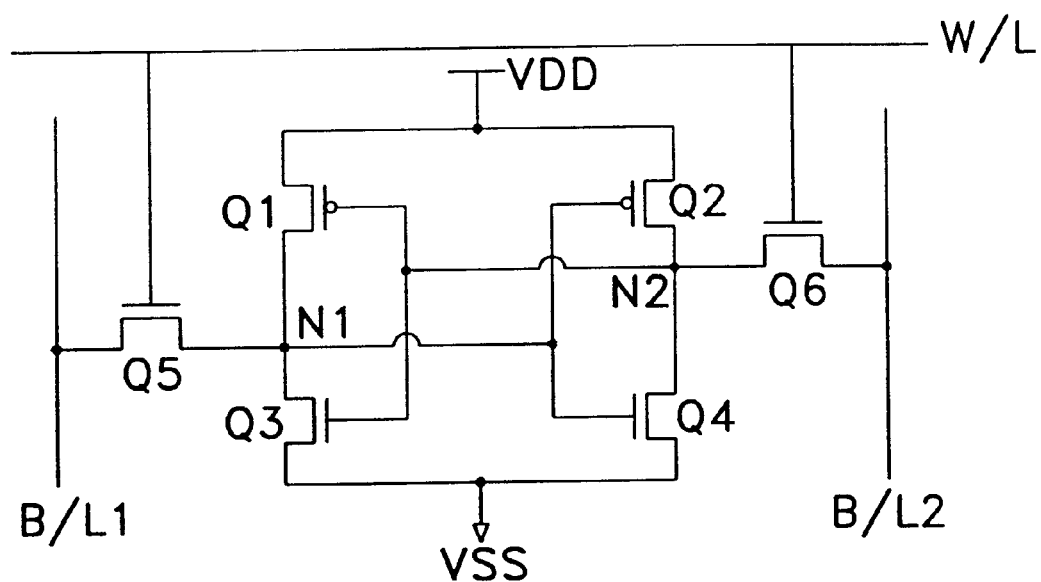
FIG. 1 is a circuit diagram of a conventional SRAM cell with a full CMOS cell structure.
Figure 2:
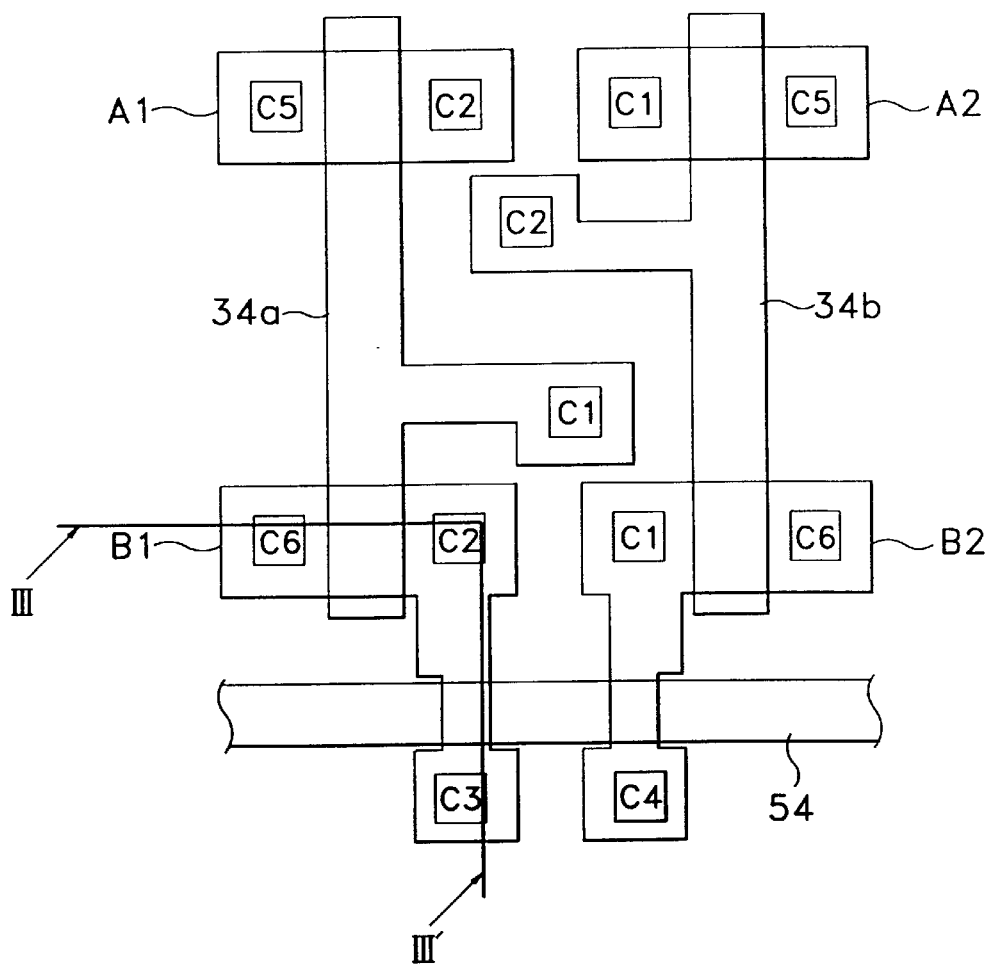
FIG. 2 is a plane view of a conventional SRAM cell with a full CMOS cell structure.
Figure 3:
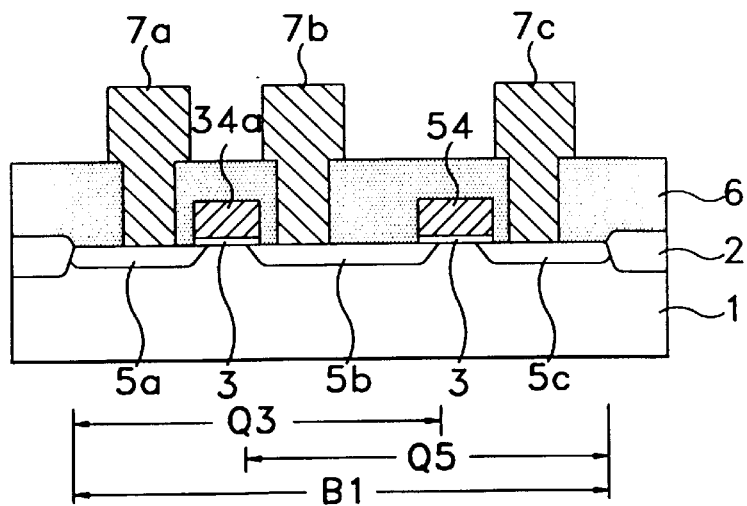
FIG. 3 is a sectional view of a pull-down transistor and an access transistor of the conventional SRAM cell.
Figure 4:
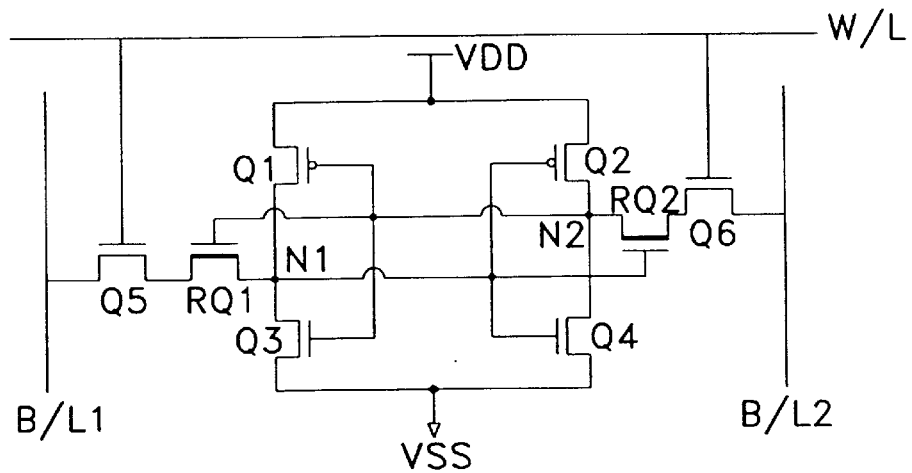
FIG. 4 is a circuit diagram of a SRAM cell with a full CMOS cell structure according to a preferred embodiment of the present invention.
Figure 5:
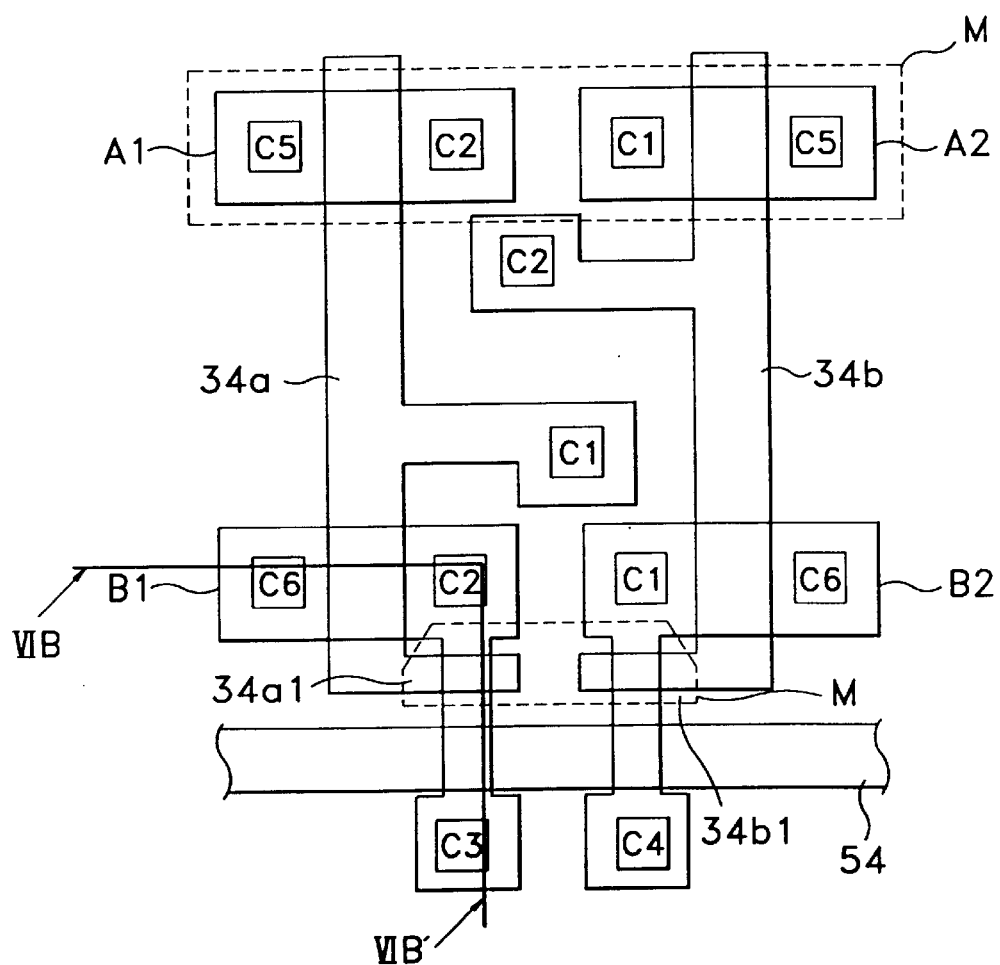
FIG. 5 is a plan view of the SRAM cell with the full CMOS cell structure according to a preferred embodiment of the present invention.

Meanwhile, in FIG. 4 to FIG. 6, like reference numbers are assigned with those of above-mentioned FIG. 1 and therefore their description thereof are omitted.

FIG. 4 is a circuit diagram of a SRAM cell with a full CMOS structure according to a preferred embodiment of the present invention.

As illustrated in FIG. 4, the SRAM cell according to the invention has devices for use in resistor, preferably an N channel depletion transistors RQ1 and RQ2 between the cell nodes N1 and N2 and the NMOS transistors Q5 and Q6 for use in access device. Gates of the depletion transistors RQ1 and RQ2 are connected with the cell nodes N2 and N1. Sources of the depletion transistors RQ1 and RQ2 are connected with the drains NMOS transistors Q5 and Q6 for use in access devices, and drains of the depletion transistors RQ1 and RQ2 are connected with the cell nodes N1 and N2. The depletion transistors RQ1 and RQ2 work on the NMOS transistors Q5 and Q6 for use in access devices as resistors, so that the current amount of the NMOS transistors Q5 and Q6 for use in access device is reduced.

FIG. 5 is a plan view of the SRAM cell illustrated in FIG. 4. In FIG. 5, 34$a$1 and 34$b$1 are gate lines of the depletion transistors RQ1 and RQ2. As illustrated in FIG. 5, gate lines 34$a$ and 34$b$ of the PMOS transistors Q1 and Q2 for use in pull-up devices and the NMOS transistors Q3 and Q4 for use in pull-down devices are projected between the cell node contact regions C1 and the gate line 54 of the NMOS transistors Q5 and Q6 for use in access devices, so that the gate lines 34$a$1 and 34$b$1 of the depletion transistors RQ1 and RQ2 are formed. As shown in FIG. 5, the depletion transistors RQ1 and RQ2 are inserted without increasing the size of the SRAM cell. There are also provided mask pattern M used for implanting ion to control the P channel threshold voltage (Vt) of the PMOS transistors Q1 and Q2 for use in pull-up devices. Here, the mask pattern M is an open pattern to expose the active regions A1 and A2 of the PMOS transistors Q1 and Q2 and the channel regions of the depletion transistors RQ1 and RQ2 in the active regions B1 and B2. The N channel regions of the depletion transistors RQ1 and RQ2 are formed at the same time that ion implanting of N type impurity ions to control a threshold voltage of the PMOS transistors Q1 and Q2 occurs.

Meanwhile, FIG. 5 illustrates only the full CMOS SRAM cell structure, the above structure can be also applied to the HRL SRAM cell and P-channel polysilicon TFT SRAM cell.

Figure 6A:
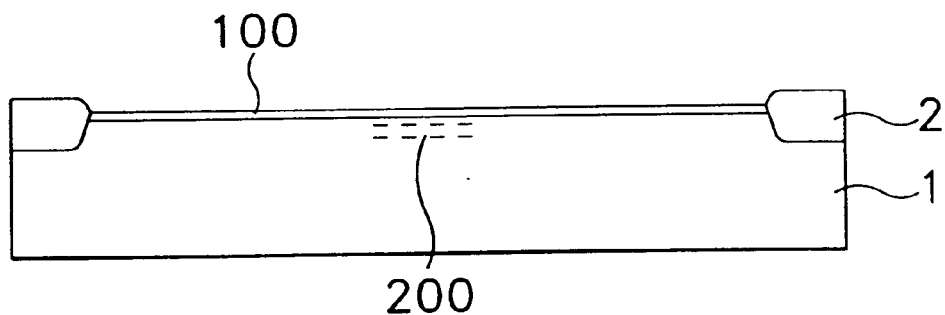
FIGS. 6A and 6B are sectional views showing a method for manufacturing the SRAM cell according to a preferred embodiment of the present invention.
Figure 6B:
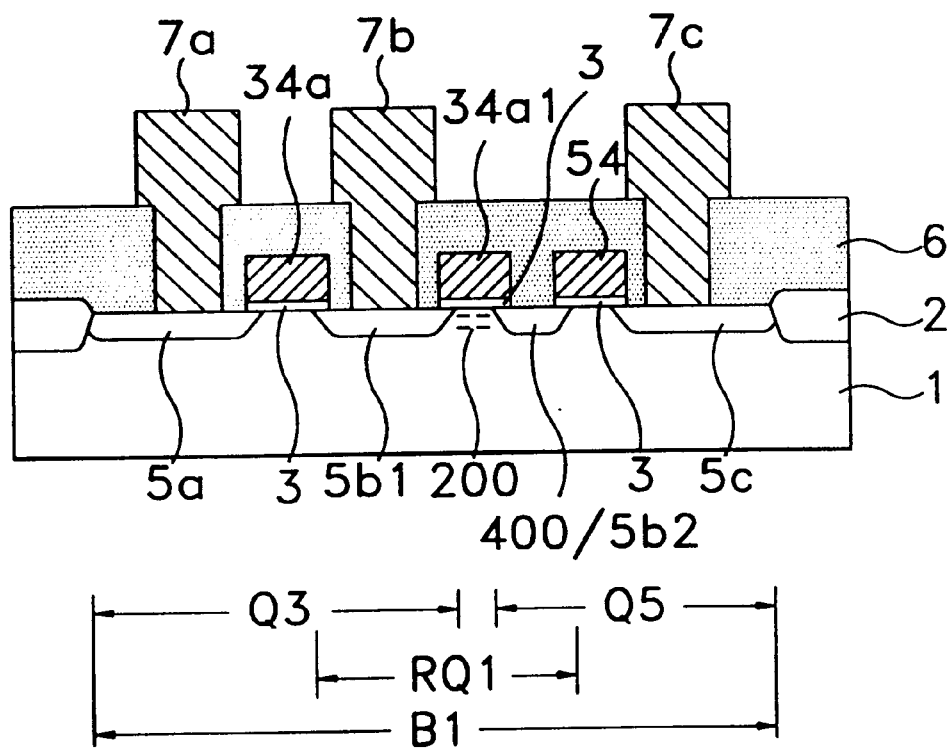

Referring to FIGS. 6A and 6B, a method of manufacturing the SRAM cell having the depletion transistors will be described. Here, FIGS. 6A and 6B are sectional views of the active region B1 taken along the line VIB1–VIB1' of FIG. 5, and illustrate a method of forming the depletion transistor RQ1 between the NMOS transistor Q3 for use in pull-down devices and the NMOS transistor Q5 for use in access devices.

As illustrated in FIG. 6A, a field oxide layer 2 is formed on a P type semiconductor substrate 1 by a known LOCOS (LOCal Oxidation of Silicon) technique, so that the active region B1 is defined. A screen oxide layer 100 is formed on the substrate 1 between the field oxide layer 2. N type impurity ions, preferably, P or As ion, are then ion implanted into a predetermined channel area of the depletion transistor RQ1 in the active region B1 to concentration of about $5 \times 10^{10}$ to $5 \times 10^{12}$ ions/cm$^2$, so that the N channel region 200 of the depletion transistor RQ1 is formed. The N channel region 200 of the depletion transistor RQ1 is formed by the ion implanting using the mask pattern M illustrated in FIG. 5 At this time, the ion-implantation step is carried out during ion implantation to control the P channel Vt of the PMOS transistors Q1 and Q2 for use in pull-up devices. Therefore, another process step is not added to forming the depletion transistors RQ1 and RQ2.

As illustrated in FIG. 6B, the screen oxide layer 100 is removed and the gate insulating layer 3 is formed on the substrate 1. A polysilicon layer is formed on the gate insulating layer 3. The polysilicon layer and the gate insulating layer 3 are etched, so that gates 34a, 34a1 and 54 of the NMOS transistor Q3 for use in pull-down devices, the depletion transistor RQ1 and NMOS transistor Q5 for use in access devices are formed. Source and drain regions 5a, 5b1, 400/5b2, 5c are then formed in the active region B1. At this time, the gate 34a1 of the depletion transistor RQ1 is formed on the N-channel region 200 and between the gate 34a of the NMOS transistor Q3 for use in pull-down devices and the gate 54 NMOS transistor Q5 for use in access devices. The drain region 5b1 is a common drain region of the NMOS transistor Q3 for use in pull-down devices and the depletion transistor RQ1. The source region 400 of the depletion transistor RQ1 is connected to the drain region 5b2 of the NMOS transistor Q5 for use in access devices.

Thereafter, an intermediate insulating layer 6 is formed on the overall surface of the substrate 1, and etched to expose the source and drain regions 5a and 5b1 of the NMOS transistor Q3 for use in pull-down devices and the source region 5c of the NMOS transistor Q5 for use in access devices, thereby forming contact holes. A metal layer is then deposited on the intermediate insulating layer 6 to fill the contact holes. The metal layer is then patterned thereby forming metal interconnection layers 7a, 7b and 7c.

According to the present invention, the depletion transistor as working a resistor is inserted between the cell nodes and the access devices, so that the current amount of the access devices is reduced. Therefore, the cell ratio is increased thereby enhancing operational characteristic of the SRAM cell. In addition, a additional process for reducing amount of the current of the access devices is not carried out and the depletion transistor is formed an already available area thereby not increasing the size of the SRAM cell.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. A method of manufacturing a SRAM cell having pull-up devices, pull-down devices and access devices, the manufacturing method comprising the steps of:

providing a semiconductor substrate of a first conductivity type of which active region of said pull-down device and said access device is defined;

forming a channel region of a second conductivity type in a predetermined portion of said active region between said pull-down device and said access device region;

forming a gate insulating layer on said substrate;

forming first and second gates on said pull-down device and said access device region and a third gate on said channel region; and forming impurity diffusion regions of said second conductivity type in the active region both sides of said first, second and third gates.

2. The method of manufacturing an SRAM cell according to claim 1, wherein said channel region is formed at the same time that ion implanting of impurity ions said second conductivity type to control a threshold voltage of said pull-up devices occurs.

3. The method of manufacturing an SRAM cell according to claim 2, wherein said impurity ion is P.

4. The method of manufacturing an SRAM cell according to claim 2, wherein said channel region is formed by implanting P ion to concentration of $5 \times 10^{10}$ to $5 \times 10^{12}$ ions/cm$^2$.

5. The method of manufacturing an SRAM cell according to claim 2, wherein said impurity ion is As.

6. The method of manufacturing an SRAM cell according to claim 2, wherein said channel region is formed by implanting As ion to concentration of $5 \times 10^{10}$ to $5 \times 10^{12}$ ions/cm$^2$.

7. The method of manufacturing an SRAM cell according to claim 1, wherein the pull-up devices are P channel bulk MOSFETs.

8. The method of manufacturing an SRAM cell according to claim 1, wherein the pull-up devices are resistors.

9. The method of manufacturing an SRAM cell according to claim 1, wherein the pull-up devices are P channel polysilicon TFTs.

* * * * *

UNITED STATES PATENT AND TRADEMARK OFFICE
CERTIFICATE OF CORRECTION

PATENT NO. : 6,162,673
DATED : December 19, 2000
INVENTOR(S) : Jae-Kap Kim

It is certified that error appears in the above-identified patent and that said Letters Patent is hereby corrected as shown below:

Column 1,
Line 27, after "method", insert -- . --.

Column 5,
Line 36, after "5", insert -- . --.

Signed and Sealed this

Twenty-third Day of October, 2001

Attest:

*Nicholas P. Godici*

NICHOLAS P. GODICI
*Attesting Officer*     *Acting Director of the United States Patent and Trademark Office*